US009721889B1

(12) United States Patent
Niu et al.

(10) Patent No.: US 9,721,889 B1
(45) Date of Patent: Aug. 1, 2017

(54) MIDDLE OF THE LINE (MOL) METAL CONTACTS

(71) Applicant: GLOBALFOUNDRIES INC., Grand Cayman, KY (US)

(72) Inventors: Chengyu C. Niu, Niskayuna, NY (US); Vimal K. Kamineni, Mechanicville, NY (US); Mark V. Raymond, Latham, NY (US); Xunyuan Zhang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/219,378

(22) Filed: Jul. 26, 2016

(51) Int. Cl.
| *H01L 23/48* | (2006.01) |
| *H01L 23/528* | (2006.01) |
| *H01L 23/532* | (2006.01) |
| *H01L 23/535* | (2006.01) |
| *H01L 21/768* | (2006.01) |

(52) U.S. Cl.
CPC ...... *H01L 23/5283* (2013.01); *H01L 21/7684* (2013.01); *H01L 21/76805* (2013.01); *H01L 21/76844* (2013.01); *H01L 21/76849* (2013.01); *H01L 21/76895* (2013.01); *H01L 21/76897* (2013.01); *H01L 23/535* (2013.01); *H01L 23/53266* (2013.01)

(58) Field of Classification Search
CPC ........... H01L 23/5283; H01L 23/53266; H01L 23/535
USPC ................................ 257/751, 758, 762, 763
See application file for complete search history.

(56) References Cited

U.S. PATENT DOCUMENTS

| 5,688,718 | A |  | 11/1997 | Shue |
| 5,714,804 | A | * | 2/1998 | Miller ............... H01L 21/76843 257/734 |
| 6,028,362 | A | * | 2/2000 | Omura .............. H01L 21/76807 257/751 |
| 6,037,664 | A | * | 3/2000 | Zhao ................... H01L 21/7681 257/751 |
| 6,342,733 | B1 | * | 1/2002 | Hu ........................ H01L 21/288 257/750 |
| 6,348,709 | B1 |  | 2/2002 | Graettinger et al. |
| 6,348,731 | B1 | * | 2/2002 | Ashley .............. H01L 21/76846 257/751 |
| 6,498,397 | B1 | * | 12/2002 | Achuthan ........... H01L 23/5226 257/751 |
| 6,548,415 | B2 |  | 4/2003 | Ting et al. |
| 6,872,668 | B1 |  | 3/2005 | Cao et al. |

(Continued)

*Primary Examiner* — Nitin Parekh
(74) *Attorney, Agent, or Firm* — Gibb & Riley, LLC; Francois Pagette

(57) ABSTRACT

Integrated circuit (IC) structure embodiments and methods of forming them with middle of the line (MOL) contacts that incorporate a protective cap, which provides protection from damage during back end of the line (BEOL) processing. Each MOL contact has a main body in a lower portion of a contact opening. The main body has a liner (e.g., a titanium nitride layer) that lines the lower portion and a metal layer on the liner. The MOL contact also has a protective cap in an upper portion of the contact opening above the first metal layer and extending laterally over the liner to the sidewalls of the contact opening. The protective cap has an optional liner, which is different from the liner in the lower portion, and a metal layer, which is either the same or different than the metal in the main body.

20 Claims, 10 Drawing Sheets

(56) References Cited

U.S. PATENT DOCUMENTS

| | | | | |
|---|---|---|---|---|
| 7,176,571 | B2* | 2/2007 | Cheng | H01L 21/76807 257/750 |
| 8,492,808 | B2* | 7/2013 | Omori | H01L 27/228 257/295 |
| 8,564,132 | B2 | 10/2013 | Yang et al. | |
| 9,275,901 | B1 | 3/2016 | Ok et al. | |
| 2002/0037644 | A1 | 3/2002 | Rha et al. | |
| 2004/0084773 | A1* | 5/2004 | Johnston | H01L 21/28562 257/751 |
| 2008/0254617 | A1 | 10/2008 | Adetutu et al. | |
| 2010/0052175 | A1* | 3/2010 | Seidel | H01L 21/76849 257/762 |
| 2010/0155949 | A1* | 6/2010 | Jain | H01L 21/76838 257/751 |
| 2013/0093092 | A1* | 4/2013 | Kanki | H01L 23/53238 257/758 |
| 2015/0123279 | A1* | 5/2015 | Chi | H01L 21/76846 257/751 |
| 2015/0137377 | A1* | 5/2015 | Bao | H01L 23/5226 257/758 |
| 2015/0225605 | A1* | 8/2015 | Steinbrecher | C08G 18/3221 528/73 |
| 2015/0279733 | A1 | 10/2015 | Ferrer et al. | |

\* cited by examiner

MIDDLE OF THE LINE (MOL) METAL CONTACTS

FIELD OF THE INVENTION

The present invention relates to the middle of the line (MOL) contacts that connect the back end of the line (BEOL) metal levels to the semiconductor devices in an integrated circuit (IC) structure and to methods of forming an IC structure, wherein the MOL contact formation processes are highly compatible with the BEOL metal level formation processes.

BACKGROUND

Semiconductor devices in an integrated circuit (IC) structure will have middle of the line (MOL) contacts. For example, a field effect transistor (FET) can have source/drain contacts (also referred to as CA contacts) and a gate contact (also referred to as a CB contact). The source/drain contacts can extend vertically through interlayer dielectric material from metal wires or vias in a first back end of the line (BEOL) metal level (referred to herein as M0) to contact plugs (also referred to as TS contacts) on the source/drain regions of the FET and the gate contact can extend vertically from a metal wire or via in the first BEOL metal level (M0) through the interlayer dielectric material to the gate electrode of the FET. Historically, these MOL contacts are formed by etching the contact openings in the interlayer dielectric material, lining the contact openings with a liner that incorporates one or more barrier layers (e.g., of titanium and/or titanium nitride), filling the contact openings with a metal (e.g., tungsten) and performing a chemical-mechanical polishing (CMP) process to remove all material from above the top surface of the interlayer dielectric material. The first BEOL metal level (M0) is then formed above the interlayer dielectric material with metal wires or vias immediately adjacent to the top surface of the MOL contacts. There is, however, a need in the art for a method of forming an IC structure, wherein the MOL contacts are less subject to damage during BEOL processing.

SUMMARY

In view of the foregoing, disclosed herein are various embodiments of an integrated circuit (IC) structure with middle of the line (MOL) contacts that incorporate a protective cap, which provides protection from damage during subsequent BEOL metal level formation processes. Specifically, each MOL contact can have a main body in a lower portion of a contact opening. The main body can have a liner (e.g., a titanium and/or titanium nitride liner) that lines the lower portion and a metal layer on the liner. The MOL contact can further have a protective cap in an upper portion of the contact opening on the top surface of the first metal layer and extending laterally over the liner to the sidewalls of the contact opening. The protective cap can have an optional liner, which is different from the liner in the lower portion (e.g., which is devoid of titanium and titanium nitride), and can further have a metal layer, which is either the same metal used in the main body or a different metal. Also disclosed herein are methods of forming these structure embodiments.

More particularly, disclosed herein are various embodiments of an integrated circuit (IC) structure with middle of the line (MOL) contacts that incorporate a protective cap, which provides protection from damage during subsequent BEOL metal level formation processes. Each IC structure can have at least one layer of interlayer dielectric material above a semiconductor device and a contact in a contact opening, which extends vertically through the interlayer dielectric material and which has sidewalls, a lower portion and an upper portion above the lower portion. The contact can have a main body and a protective cap.

The main body can be in the lower portion of the contact opening and can be electrically connected to the semiconductor device. This main body can include a first liner that lines the lower portion of the contact opening and a first metal layer that is on the first liner within the lower portion. The first liner can be a single-layer liner or a multi-layer liner (also referred to herein as a liner stack).

The protective cap can be in the upper portion of the contact opening immediately adjacent to the top surface of the first metal layer. The protective cap can further extend laterally over the first liner to the sidewalls of the contact opening. The protective cap can include a second metal layer. Optionally, the protective cap can also include second liner (e.g., an optional single-layer or multi-layer liner) that lines the upper portion of the contact opening and, in this case, the second metal layer is on the second liner. If present, the second liner should have different barrier material(s) than the first liner. The second metal layer can be either the same metal used in the main body or a different metal.

Also disclosed herein are methods of forming the above-described integrated circuit (IC) structure embodiments with middle of the line (MOL) contacts that incorporate a protective cap, which provides protection from damage during subsequent BEOL metal level formation processes. In the methods, at least one layer of interlayer dielectric material can be formed above a semiconductor device. At least one contact opening can be formed such that it extends vertically through the interlayer dielectric material. This contact opening can have sidewalls, a lower portion and an upper portion above the lower portion.

Subsequently, a contact can be formed in the contact opening. This contact can be formed so as to have a main body in the lower portion of the contact opening and a protective cap in the upper portion of the contact opening. The main body can be formed so that it is electrically connected to the semiconductor device and so that it includes a first liner (e.g., a single-layer liner or a multi-layer liner), which lines the lower portion of the contact opening, and a first metal layer, which is on the first liner within the lower portion. Next, the protective cap can be formed so that it is immediately adjacent to the top surface of the first metal layer and so that it extends laterally over the first liner to the sidewalls. The protective cap can be formed so that it includes a second metal layer. Optionally, it can be formed so that it also includes a second liner (e.g., an optional single-layer or multi-layer liner), which lines the upper portion of the contact opening. In this case, the second metal layer is formed on the second liner. The second liner should have different barrier material(s) than the first liner and the second metal layer can be either the same metal used in the main body or a different metal.

In one exemplary embodiment of the method, at least one layer of interlayer dielectric material can be formed above a semiconductor device. At least one contact opening can be formed such that it extends vertically through the interlayer dielectric material. This contact opening can have sidewalls, a lower portion and an upper portion above the lower portion.

Subsequently, a contact can be formed in the contact opening. This contact can be formed so as to have a main body in the lower portion of the contact opening and a protective cap in the upper portion of the contact opening. The main body can be formed so that it is electrically connected to the semiconductor device and so that it includes a first liner, which lines the lower portion of the contact opening, and a first metal layer, which is on the first liner within the lower portion. In this embodiment, the first liner can include one or more barrier layers. These barrier layer(s) can be titanium and/or titanium nitride. Additionally, the first metal layer can be a tungsten or cobalt layer. Next, the protective cap can be formed so that it is immediately adjacent to the top surface of the first metal layer and so that it extends laterally over the first liner to the sidewalls. The protective cap can be formed so that it includes a second metal layer. Optionally, it can be formed so that it also includes a second liner, which lines the upper portion of the contact opening. In this case, the second metal layer is formed on the second liner. The second liner should be different from the first liner (e.g., should be devoid of titanium and titanium nitride). For example, the second liner can be a tantalum nitride liner. Additionally, the second metal layer can be a different metal than the first metal layer. For example, if the first metal layer is a tungsten layer, the second metal can be cobalt, copper, ruthenium, aluminum, etc.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
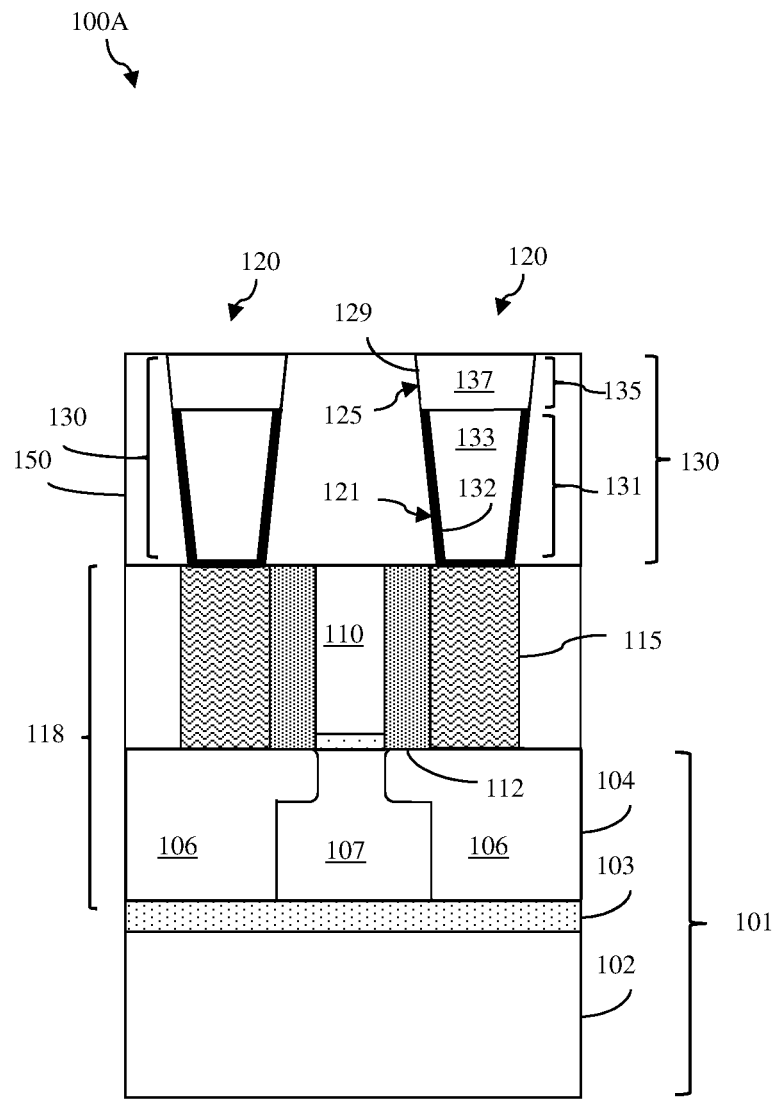
FIG. 1 is a cross-section diagram illustrating an embodiment of an integrated circuit (IC) structure with middle of the line (MOL) contacts that incorporate a protective cap.

As mentioned above, semiconductor devices in an integrated circuit (IC) structure will have middle of the line (MOL) contacts. For example, a field effect transistor (FET) can have source/drain contacts (also referred to as CA contacts) and a gate contact (also referred to as a CB contact). The source/drain contacts can extend vertically through interlayer dielectric material from metal wires or vias in a first back end of the line (BEOL) metal level (referred to herein as M0) to contact plugs (also referred to as TS contacts) on the source/drain regions of the FET and the gate contact can extend vertically from a metal wire or via in the first BEOL metal level (M0) through the interlayer dielectric material to the gate electrode of the FET. Historically, these MOL contacts are formed by etching the contact openings in the interlayer dielectric material, lining the contact openings with a liner that incorporates one or more barrier layers (e.g., of titanium and/or titanium nitride), filling the contact openings with a metal (e.g., tungsten) and performing a chemical-mechanical polishing (CMP) process to remove all material from above the top surface of the interlayer dielectric material. The first BEOL metal level (M0) is then formed above the interlayer dielectric material with metal wires or vias immediately adjacent to the top surface of the MOL contacts. Unfortunately, conventional BEOL metal line and via formation processes can result in damage to the structure of the MOL contacts.

For example, during BEOL metal level formation processes a metal hardmask and, particularly, a titanium nitride metal hardmask layer may be formed on the interlayer dielectric material immediately adjacent to the MOL contacts. When this hardmask layer is subsequently removed, etching away of exposed titanium and/or titanium nitride materials in the liner lining the contact openings can occur and, in extreme cases, damage to the metal/semiconductor interface can also occur. The resulting voids can lead to device failure, increased difficulty for BEOL metallization (e.g., due to poor barrier properties and poor seed coverage) and compromised reliability (e.g., copper diffusion from the first BEOL metal level (M0) to the semiconductor devices can easily occur through such voids).

In view of the foregoing, disclosed herein are various embodiments of an integrated circuit (IC) structure with middle of the line (MOL) contacts that incorporate a protective cap, which provides protection from damage during subsequent BEOL metal level formation processes. Specifically, each MOL contact can have a main body in a lower portion of a contact opening. The main body can have a liner (e.g., a titanium and/or titanium nitride liner) that lines the lower portion and a metal layer on the liner. The MOL contact can further have a protective cap in an upper portion of the contact opening on the top surface of the first metal layer and extending laterally over the liner to the sidewalls of the contact opening. The protective cap can have an optional liner, which is different from the liner in the lower portion (e.g., which is devoid of titanium and titanium nitride), and can further have a metal layer, which is either the same metal used in the main body or a different metal. Also disclosed herein are methods of forming such IC structure embodiments.

More particularly, referring to FIGS. 1-4 disclosed herein are various embodiments 100A-100D of an integrated circuit (IC) structure, each with middle of the line (MOL) contacts 130 that incorporate a protective cap 135, which provides protection from damage during subsequent BEOL metal level formation processes.

Specifically, each of the embodiments 100A-100D of the IC structure can incorporate semiconductor devices on a semiconductor wafer. The semiconductor wafer can be a semiconductor-on-insulator (SOI) wafer 101 (as shown), which includes a semiconductor substrate 102 (e.g., a silicon substrate or any other suitable semiconductor substrate), an insulator layer 103 (e.g., a silicon dioxide (SiO2) layer or any other suitable insulator layer) on the semiconductor substrate 102 and a semiconductor layer 104 (e.g., a silicon layer, a silicon germanium layer, a gallium nitride layer or any other suitable semiconductor layer) on the insulator layer 103. Alternatively, the semiconductor wafer can be a bulk semiconductor wafer (e.g., a silicon wafer or any other suitable wafer, such as a hybrid orientation (HOT) wafer), wherein the upper portion is isolated from a lower portion of the wafer, for example, by a deep well (not shown). An exemplary semiconductor device and, particularly, an exemplary field effect transistor (FET) 118 is shown on the semiconductor wafer. The FET 118 can have source/drain regions 106, a channel region 107 between the source/drain regions 106, a gate (including a gate dielectric layer and a gate electrode 110) on the channel region 107, and gate sidewall spacers 112 on opposing sidewalls of the gate. Contact plugs 115 can be on the source/drain regions 106. These contact plugs 115 can be electrically isolated from the gate electrode 110 by the gate sidewall spacers 112. Such contact plugs 115 can be, for example, self-aligned metal plugs, such as self-aligned tungsten or cobalt plugs. The FET 118 is shown in the Figures and described above for purpose of illustration and it should be understood that any other suitable FET or semiconductor device structure could, alternatively, be incorporated into the embodiments 100A-100D of the IC structure.

The embodiments 100A-100D of the IC structure can further have at least one layer of interlayer dielectric (ILD) material 150 that covers each semiconductor device (e.g., that covers the FET 118). The ILD material 150 can have a bottom surface that is above the FET 118 and that is immediately adjacent to the contact plugs 115. The ILD material 150 can further have a top surface that is opposite the bottom surface. The top and bottom surfaces of the ILD material 150 can be essentially planar surfaces. The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

The embodiments 100A-100D of the IC structure can further have MOL contacts 130 electrically connected to the semiconductor devices. For example, as illustrated, embodiments 100A-100D of the IC structure can each have MOL contacts 130 to the contact plugs 115 of the FET 118 such that the MOL contacts are electrically connected to the source/drain regions 106 of the FET 118. They can further have one or more MOL contacts to the gate electrode 110 of the FET 118 (not shown). In any case, the MOL contacts 130 can be positioned in contact openings 120, which extend vertically through the ILD material 150 from the top surface to the bottom surface. These contact openings 120 can have sidewalls 129, a lower portion 121 and an upper portion 125 above the lower portion 121. Each MOL contact 130 can have a main body 131 and a protective cap 135.

The main body 131 of each contact 130 can be in the lower portion 121 of the contact opening 120. For example, the main body 131 can be immediately adjacent to the contact plug 115, as shown. This main body 131 can include a first liner 132 that lines the lower portion 121 of the contact opening 120. That is, within the lower portion 121 of the contact opening 120, the first liner 132 can line the bottom surface of the contact opening 120 (e.g., the exposed portion of the contact plug 115) and the sidewalls 129 of the contact opening 120. This first liner 132 can be a single-layer liner or a multi-layer liner and can include one or more barrier layers. For example, the first liner 132 can include layers of titanium and/or titanium nitride and/or any material that may be subject to damage during subsequent BEOL metal level formation processes. The main body 131 can further include a first metal layer 133 on the first liner 132 within the lower portion 121 of the contact opening. The first metal layer 133 can be, for example, a tungsten layer, a cobalt layer, or a layer of any other metal suitable for use in MOL contacts. The upper edge of the first liner 132 and the top surface of the first metal layer 133 can be essentially co-planar.

The protective cap 135 can be in the upper portion 125 of the contact opening 120 immediately adjacent to the top surface of the first metal layer 133. The protective cap 135 can further extend laterally over the first liner 132 to the sidewalls 129 of the contact opening 120. That is, the protective cap 135 can extend between and be immediately adjacent to the sidewalls 129 in the upper portion 125 of the contact opening.

The protective cap 135 can include a second metal layer 137. This second metal layer 137 can be the same metal material used in the first metal layer 133. For example, both the first metal layer 133 and the second metal layer 137 can be tungsten or cobalt. Alternatively, this second metal layer 137 can be a different metal than that used in the first metal layer 133. For example, if the first metal layer is a tungsten layer, the second metal layer 137 can be copper, aluminum, cobalt, ruthenium, lutetium or any other metal suitable for use in MOL contacts and compatible with BEOL metal level formation processes (i.e., a metal that would not be subject to damage during BEOL metal level formation processes). Similarly, if the first metal layer is a cobalt layer, the second metal layer 137 can be copper, aluminum, tungsten, ruthenium, lutetium or any other metal suitable for use in MOL contacts and compatible with BEOL metal level formation processes.

As shown in the embodiment 100A of FIG. 1, this second metal layer 137 can fill the entire upper portion 125 of the contact opening 120 and, particularly, can extend across the full width of the contact opening 120. For example, the second metal layer 137 can be a tungsten layer that fills the upper portion 125 of the contact opening 120. Alternatively, a thin film of activation material (e.g., palladium or other suitable activation material) can be on the top surface of the first metal layer 133 and the second metal layer 137 can be an electroless plated cobalt layer that fills the upper portion 125 of the contact opening 120.

Figure 2:
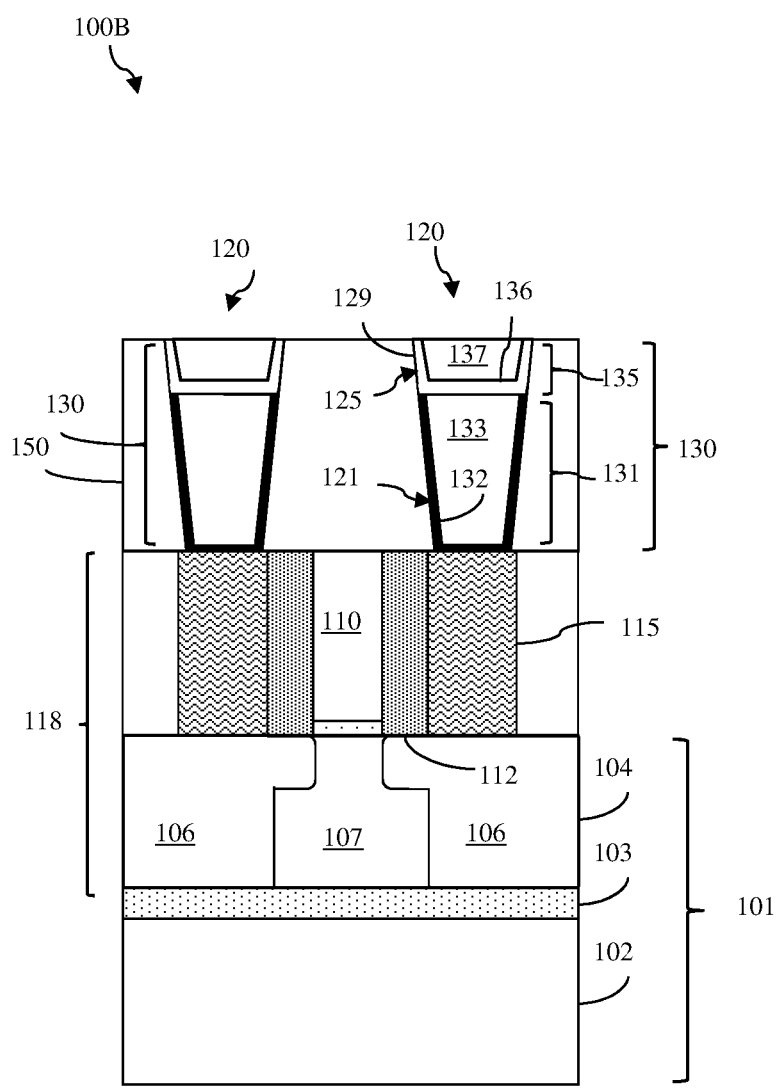
FIG. 2 is a cross-section diagram illustrating another embodiment of an IC structure with middle of the line (MOL) contacts that incorporate a protective cap.

Optionally, as shown in the embodiment 100B of FIG. 2, the protective cap 135 can further have a second liner 136 that lines the upper portion 125 of the contact opening 120. That is the second liner 136 can cover and be immediately adjacent to the sidewalls 129 in the upper portion 125 of the contact opening 120 and can further cover exposed surfaces of the first liner 132 and the first metal layer 133. The optional second liner 136 can be either a single-layer liner or a multi-layer liner. In any case, the second liner 136 should be different from the first liner 132 and, particularly, should be devoid of materials that may be incompatible with BEOL metal level formation. That is, the second liner 136 should be devoid of materials, such as titanium and titanium nitride, which are subject to damage during BEOL metal level formation processes. Thus, the second liner 136 can include, for example, one or more additional barrier layers such as tantalum and/or tantalum nitride and/or any other suitable barrier layer that is compatible with BEOL metal level formation processes. The first liner 132 and the second liner 136 can have approximately equal thicknesses. Alternatively, the first liner 132 and the second liner 136 can have different thicknesses. For example, the second liner 136 can be thicker than the first liner 132 (as shown) or, alternatively, can be thinner than the first liner 132. It is anticipated that other optional layers (not shown) could line the upper portion of the contact opening 120 within the protective cap 135. These optional layers include, but are not limited to, an adhesion layer and a seed layer. The second metal layer 137 (which again can be tungsten, cobalt, copper, aluminum, lutetium, ruthenium or any other metal suitable for use in MOL contacts and compatible with BEOL metal level formation processes) can be on the second liner 136 and can fill the remainder of the upper portion 125 of the contact opening 120.

Figure 3:
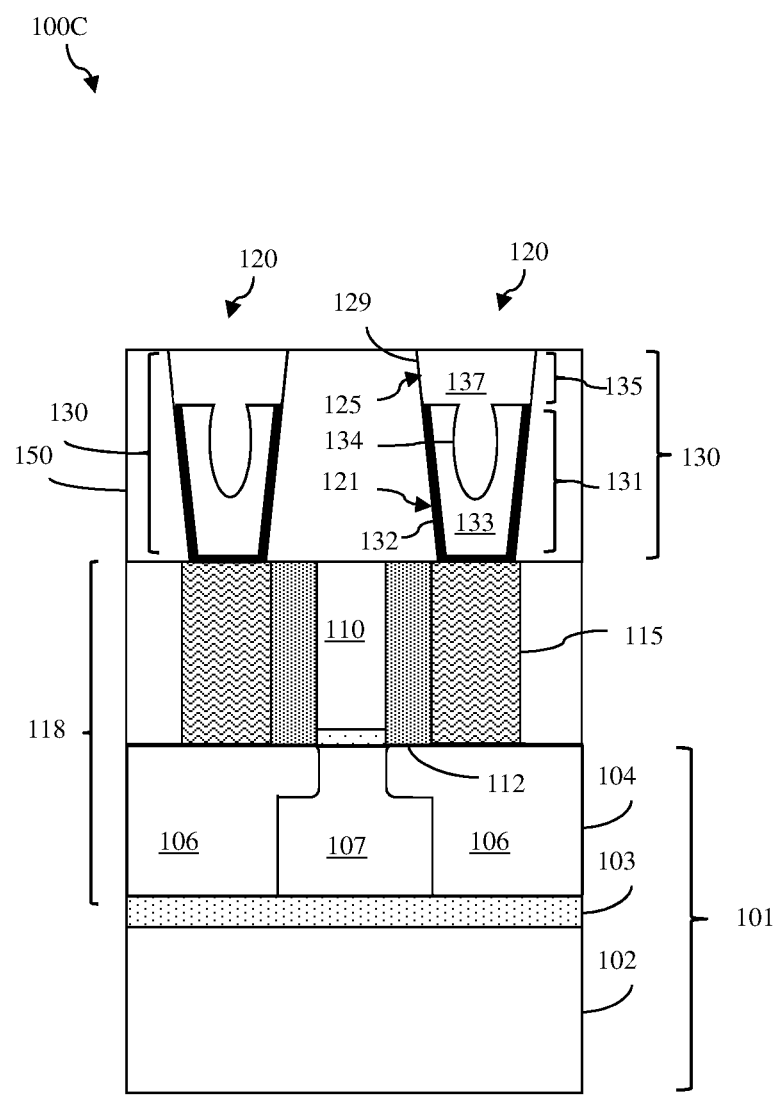
FIG. 3 is a cross-section diagram illustrating yet another embodiment of an IC structure with middle of the line (MOL) contacts that incorporate a protective cap.
Figure 4:
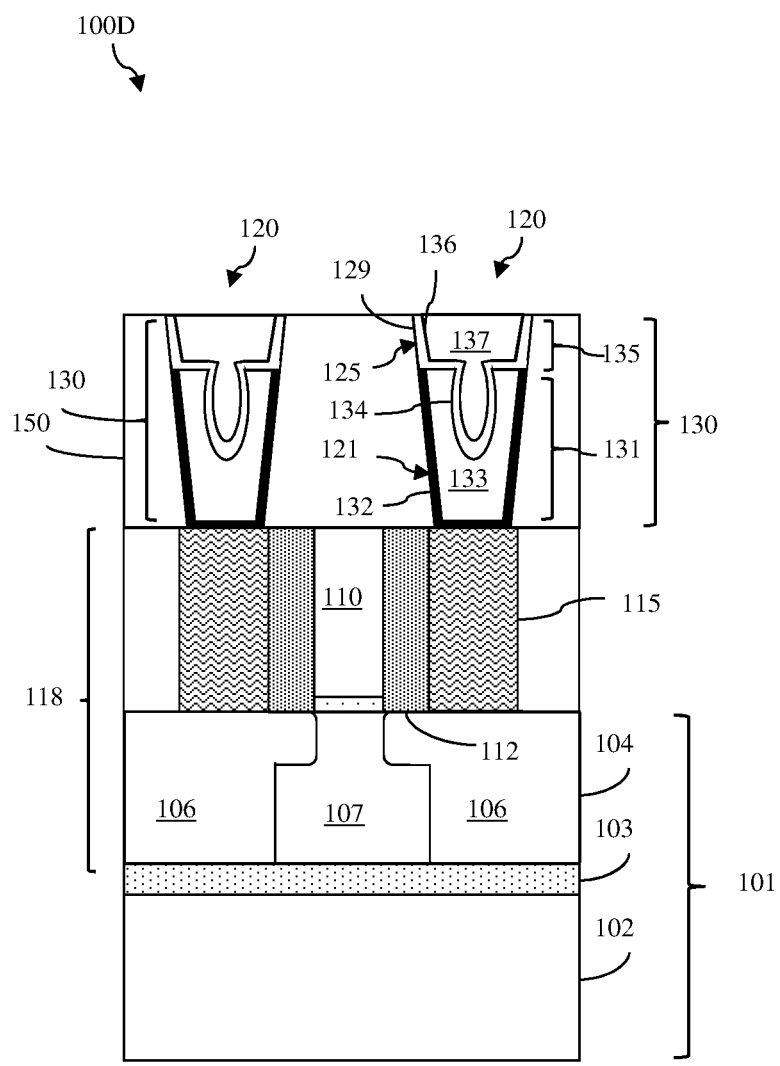
FIG. 4 is a cross-section diagram illustrating yet another embodiment of an IC structure with middle of the line (MOL) contacts that incorporate a protective cap.

As illustrated, the top surface of the protective cap 135 and, particularly, the top surface of the second metal layer 137 of the protective cap 135 and the top surface of the ILD material 150 can be essentially co-planar surfaces. Additionally, as discussed in greater detail below with regard to the methods, if any voids 134 (e.g., see FIG. 3 or 4) develop in the first metal layer 133 when it is deposited within the contact openings 120 and if those voids 134 are subsequently exposed during formation of the protective cap 135, the materials that fill the upper portions 125 of the contact openings 120 and, thereby form the protective cap 135, will also fill the voids 134. Thus, FIG. 3 shows an embodiment 100C of the IC structure, wherein, within each contact opening 120, the second metal layer 137 fills the upper portion 125 (thereby forming the protective cap 135) and also extends into the lower portion 121 to fill the void 134. Thus, in this case, the main body 131 of each contact 130 also includes material from the second metal layer 137. Similarly, FIG. 4 shows an embodiment 100D of the IC structure, wherein, within each contact opening 120, a second liner 136 lines the upper portion 125 of the contact opening 120 as well as the void 134 within the lower portion 121 and the second metal layer 137 is on the second liner 136 within the upper portion 125 (thereby forming the protective cap 135) and also extends into the lower portion 121 to fill the void 134. Thus, in this case, the main body 131 of each contact 130 also includes a portion of the second liner 136 and material from the second metal layer 137.

The protective cap 135 can be a sufficient portion of the contact 130 (i.e., can have a sufficient thickness) so as to provide desired protection to the first liner 132 of the main body 131 during subsequent BEOL metal level formation processes. For example, the protective cap 135 can encompass the upper ½₀, ⅟₁₀, ⅕, ¼, ⅓, ½, etc. of the contact 130 or any other portion of the contact 130 sufficient to eliminate exposure of the first liner 132 and provide the desired protection.

Figure 5:
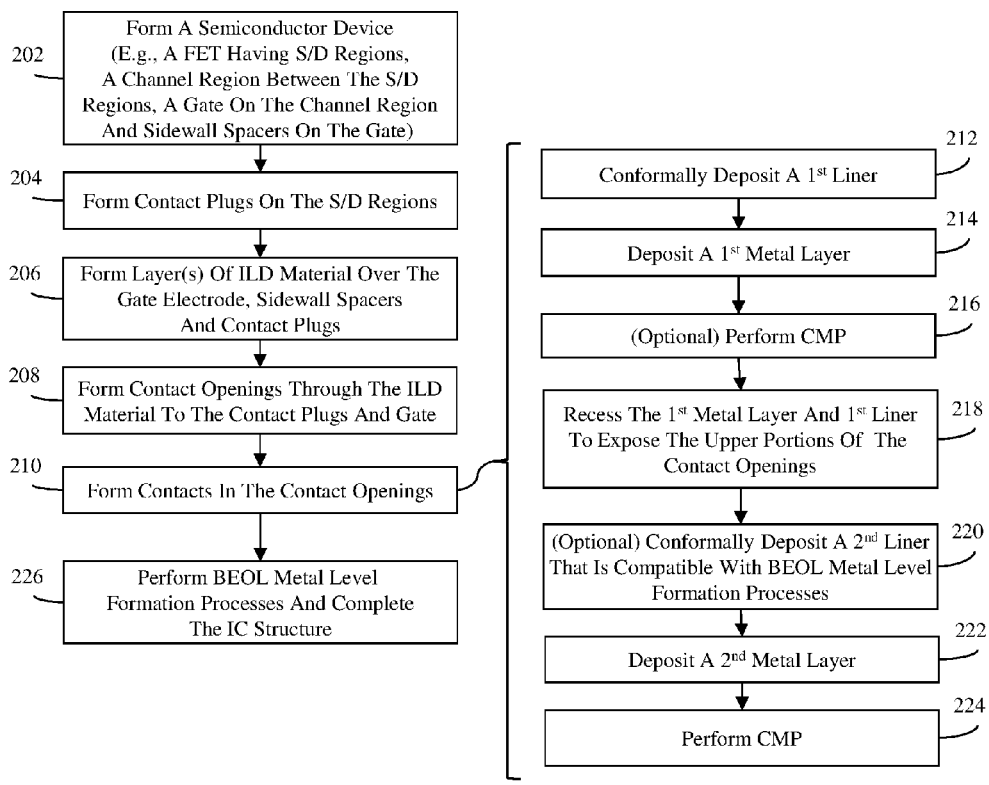
FIG. 5 is a flow diagram illustrating methods of forming IC structures with middle of the line (MOL) contacts that incorporate a protective cap.
Figure 6:
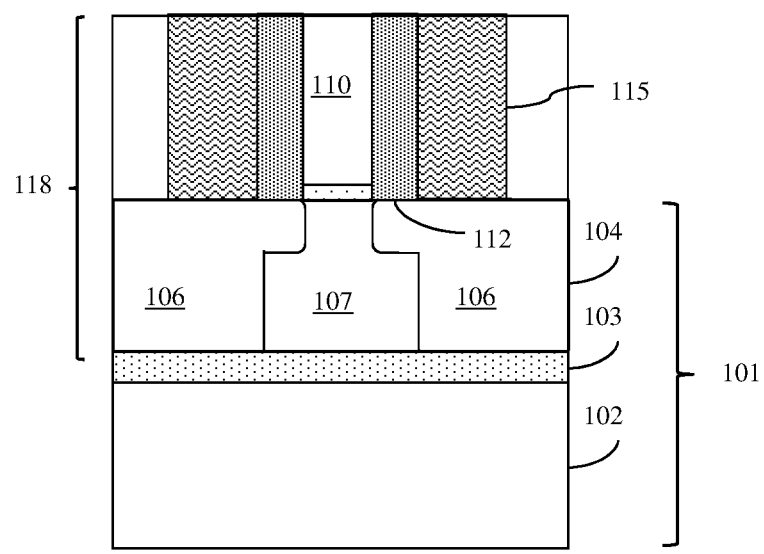
FIGS. 6-10 are cross-section diagrams each illustrating a different partially completed IC structure formed according to the flow diagram of FIG. 5.

Referring to the flow diagram of FIG. 5, also disclosed herein are methods of forming the above-described integrated circuit (IC) structure embodiments with middle of the line (MOL) contacts that incorporate a protective cap, which provides protection from damage during subsequent BEOL metal level formation processes. In the methods, semiconductor devices can be formed on a semiconductor wafer. For example, a field effect transistor (FET) 118 can be formed on a semiconductor wafer (202, see FIG. 6). Various techniques for forming a FET on a semiconductor wafer are well known in the art and, thus, the details of these techniques have been omitted from the specification in order to allow the reader to focus on the salient aspects of the disclosed methods. Generally, however, techniques for forming a FET 118 involve providing a semiconductor layer. This semiconductor layer can, for example, be the semiconductor layer 104 of a semiconductor-on-insulator (SOI) wafer 101, which includes a semiconductor substrate 102 (e.g., a silicon substrate or any other suitable semiconductor substrate), an insulator layer 103 (e.g., a silicon dioxide (SiO2) layer or any other suitable insulator layer) on the semiconductor substrate 102 and the semiconductor layer 104 (e.g., a silicon layer, a silicon germanium layer, a gallium nitride layer or any other suitable semiconductor layer) on the insulator layer 103. Alternatively, the semiconductor layer can be an upper portion of a bulk semiconductor wafer (e.g., a silicon wafer or any other suitable wafer, such as a hybrid orientation (HOT) wafer), wherein the upper portion is isolated from a lower portion of the wafer, for example, by a deep well (not shown). A semiconductor body can be defined in the semiconductor layer (e.g., by forming trench isolation regions). Subsequently, a gate structure, which includes a gate dielectric layer and a gate electrode 110 on the gate dielectric layer, can be formed above a channel region 107 in the semiconductor body; gate sidewall spacers 112 can be formed on the gate; and source/drain regions 106 and, optionally, other components (e.g., source/drain extension regions, halos, etc.), can be formed within the semiconductor body on opposing sides of the channel region 107. Contact plugs 115 can be formed above the source/drain regions 106 such that they are electrically isolated from the gate electrode 110 by the gate sidewall spacers 112 (204, see FIG. 6). These contact plugs 115 can be, for example, self-aligned metal plugs, such as cobalt or tungsten plugs. Such contact plugs can be formed, for example, using a selective chemical vapor deposition technique or any other suitable deposition technique (e.g., non-selective deposition followed by an etch-back process or a chemical-mechanical polishing (CMP) process. In any case, the contact plugs 115 can, for example, be formed so as to have a height that is approximately equal to the height of the gate electrode 110, as shown. As mentioned above, the FET 118 is shown in the Figures and described above for purpose of illustration and it should be understood that any other suitable FET or semiconductor device structure could, alternatively, be formed at process 202.

Figure 7:
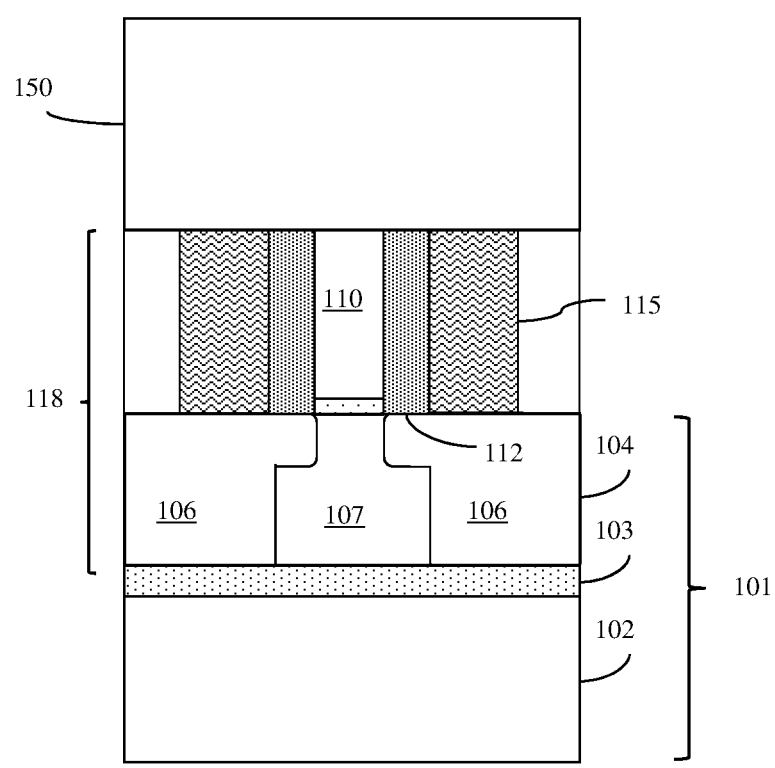

Subsequently, one or more layers of interlayer dielectric material 150 can be formed over the semiconductor devices (e.g., over the gate electrode 110, gate sidewall spacers 112 and contact plugs 115 of the FET 118) (206, see FIG. 7). Specifically, the layers of ILD material 150 can be formed so as to have a bottom surface that is above the FET 118 and that is immediately adjacent to the contact plugs 115. The ILD material 150 can further have a top surface that is opposite the bottom surface. The top and bottom surfaces of the ILD material 150 can, for example, be essentially planar surfaces. This ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Figure 8:
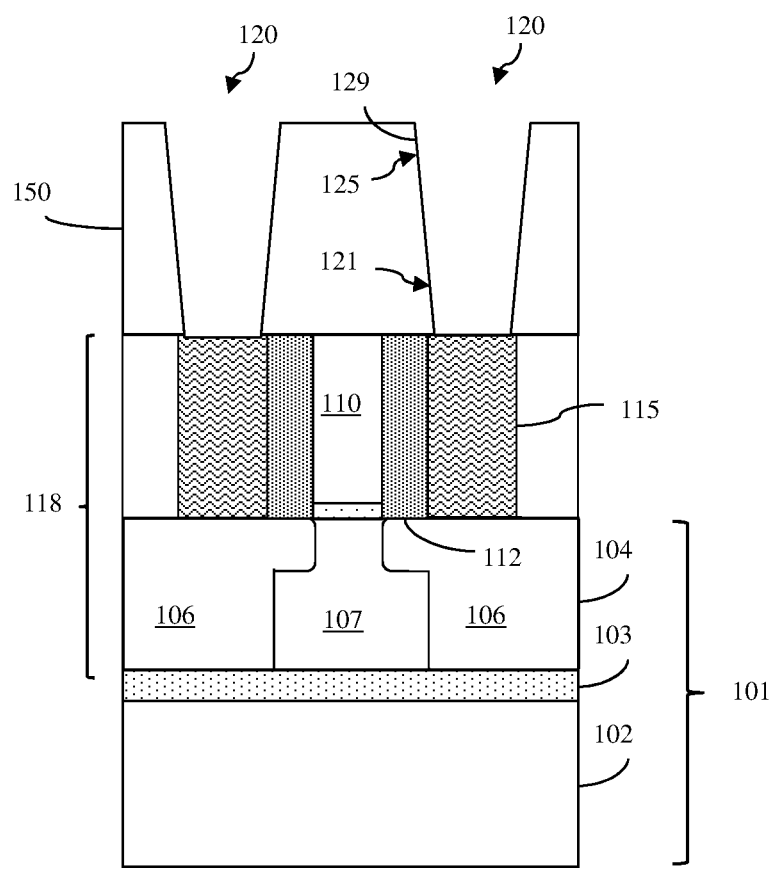

A single damascene process can then be performed in order to form contact openings through the ILD material 150 (208, see FIG. 8). For example, contact openings 120 can be formed that extend vertically through the ILD material 150 from the top surface to the bottom surface and, particularly, to the contact plugs 115 above the source/drain regions 106 of the FET 118 (as shown) and to the gate electrode 110 of the FET 118 (not shown). Each contact opening 120 can have sidewalls 129, a lower portion 121 and an upper portion 125 above the lower portion 121. Those skilled in the art will recognize that in single damascene processing a photolithography and etch pass is performed in order to define the contact openings 120 in the ILD material 150.

After the contact openings 120 are formed at process 208, contacts 130 can be formed in each of the contact openings 120 (210, as shown in FIGS. 1-4). Specifically, each contact 130 can be formed so as to have a main body 131 in the lower portion 121 of the contact opening 120 and a protective cap 135 in the upper portion 125 of the contact opening 120. During formation of the contacts 130, the main body 131 of each contact can be formed so that it is electrically connected to the semiconductor device, such as the FET 118 (e.g., so that it lands on a contact plug 115), and so that it includes a first liner 132, which lines the lower portion 121 of the contact opening 120, and a first metal layer 133, which is on the first liner 132 within the lower portion 121 of the contact opening 120. Next, the protective cap 135 can be formed so that it is immediately adjacent to the top surface of the first metal layer 133 and so that it extends laterally over the first liner 132 to the sidewalls 129 of the contact opening 120. The protective cap 135 can further be formed so that it includes an optional second liner 136, which lines the upper portion 125 of the contact opening 120, and a second metal layer 137.

Figure 9:
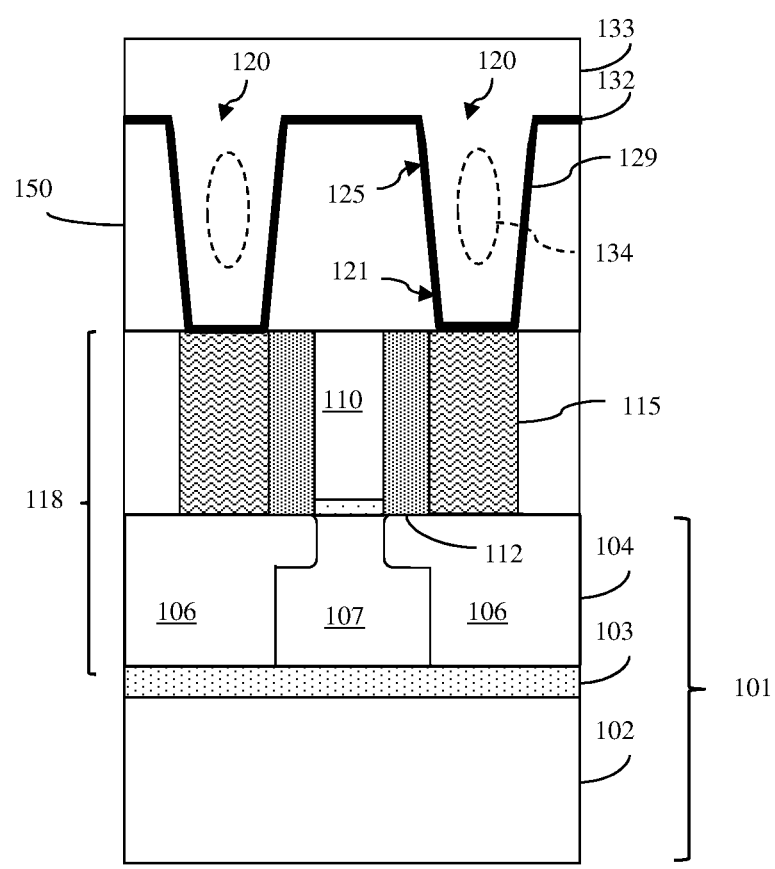

To form the main body 131 of the contact 130 in each contact opening 120 at process 210, a first liner 132 can be conformally deposited onto ILD material 150 and into the contact openings 120 and a first metal layer 133 can be deposited on the first liner 132 (212-214, see FIG. 9). The first liner 132 can be a single-layer liner or a multi-layer liner (also referred to herein as a liner stack). In any case, the first liner 132 can include one or more barrier layers. For example, the first liner 132 can include conformal layers of titanium and/or titanium nitride and/or any material that may be subject to damage during subsequent BEOL metal level formation processes. The first metal layer 133 can be, for example, a tungsten layer, a cobalt layer, or a layer of any other metal suitable for use in MOL contacts. Various techniques for depositing such barrier and metal materials are well known in the art and, thus, the details have been omitted from the specification in order to allow the reader to focus on the salient aspects of the disclosed methods. As illustrated in FIG. 9, depending upon the deposition technique used and the dimensions of the contact openings 120, voids 134 (e.g., air-filled gaps) may develop in the first metal layer 133 within the contact openings 120 (e.g., in the center portion of the contact openings).

Figure 10:
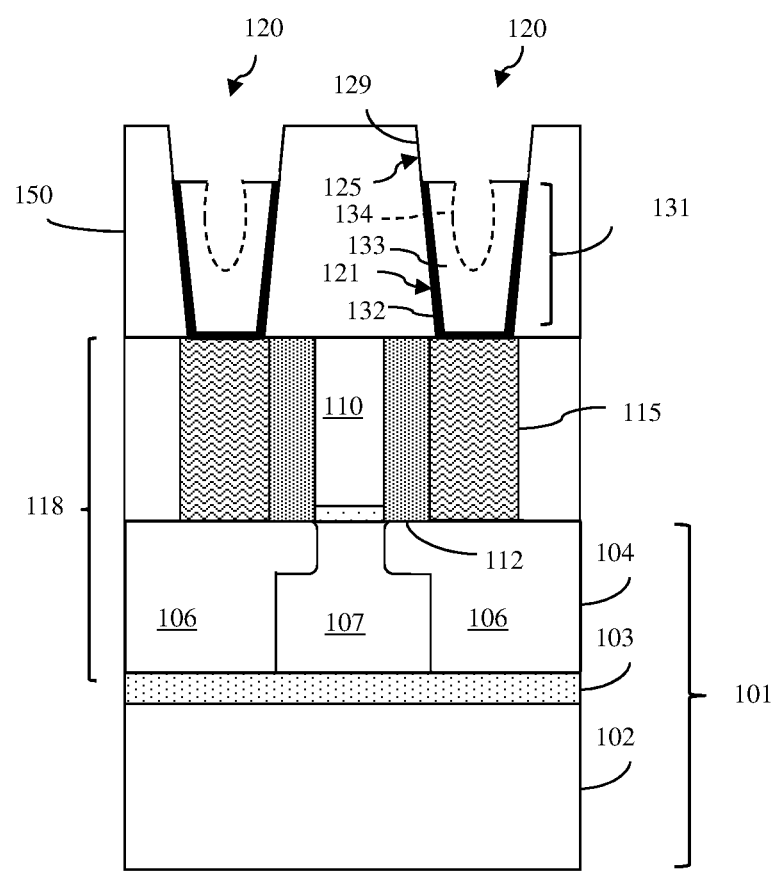

Optionally, a chemical-mechanical polishing (CMP) process can be performed in order to remove the materials of the first liner 132 and first metal layer 133 from above the top surface of the ILD material (216). The first liner 132 and the first metal layer 133 can then be recessed (i.e., selectively etched back) to expose sidewalls 129 in the upper portion 125 of each contact opening 120 (218, see FIG. 10). This recessing process 218 can remove the upper $\frac{1}{20}$, $\frac{1}{10}$, $\frac{1}{5}$, $\frac{1}{4}$, $\frac{1}{3}$, $\frac{1}{2}$, etc., of the contact 130 or any other portion sufficient to ensure that the protective cap 135 formed in the upper portion 125 of each contact opening 120 at processes 220-224, as discussed in greater detail below, has a sufficient thickness to protect the first liner 132 from exposure to BEOL metal level formation processes. Techniques for selectively etching contact liner and metal materials are well known in the art and vary depending upon the materials being etched. Thus, the details of these etch process have been omitted from the specification in order to allow the reader to focus on the salient aspects of the disclosed methods. One exemplary etch process that can be used to recess titanium and/or titanium nitride liner material and tungsten metal, as described, is a dry etch process based on boron trichloride (BCl3). It should be noted that recessing of the first metal layer 133 at process 218 might expose any voids 134, if present, within first metal layer 133.

To form a protective cap 135 in the upper portion 125 of each contact opening 120 on the main body 131 of a contact 130 at process 210, a second liner 136 can, optionally, be conformally deposited (220) and a second metal layer 137 can be deposited either directly onto the top surface of the first metal layer 133 or, onto the second liner 136 (if present) (222).

Specifically, in one method embodiment, a second metal layer 137 can be deposited at process 222 so as to fill the entire upper portion 125 of each contact opening 120 and, particularly, can be deposited so as to extend across the full width of each contact opening 120, thereby forming the embodiment 100A of the IC structure shown in FIG. 1. This second metal layer 137 could be formed, for example, by depositing tungsten such that it fills the upper portion 125 of the contact openings 120 or, alternatively, by forming a thin film of activation material (e.g., palladium or other suitable activation material) on the top surface of the first metal layer 133 and using an electroless plating to deposit cobalt onto the first metal layer 133 such that it fills the upper portion 125 of the contact opening 120. It should be noted that, if the recessing process 218, exposes voids 134 present within the first metal layer 133, then the second metal layer 137 will also fill those voids 134 (e.g., see the embodiment 100C of the IC structure shown in FIG. 3).

In another method embodiment, a second liner 136 can be conformally deposited onto the top surface of the ILD material 150 and into each contact opening 120 such that it lines the upper portion 125 of each contact opening 120. Then, a second metal layer 137 can be deposited onto the second liner 136, thereby forming the embodiment 100B of the IC structure shown in FIG. 2. In this case, the second liner 136 covers and is immediately adjacent to the sidewalls 129 in the upper portion 125 of each contact opening 120 and further covers exposed surfaces of the first liner 132 and the first metal layer 133. The second liner 136 can be formed by depositing a single barrier layer (e.g., to form a single-layer liner) or by depositing multiple barrier layers (e.g., to form a multi-layer liner). In any case, the second liner 136 should be different than the first liner 132 and, particularly, should be devoid of materials that may be incompatible with BEOL metal level formation. That is, the second liner 136 should be devoid of materials, such as titanium and titanium nitride, which are subject to damage during BEOL metal level formation processes. Thus, the second liner 136 can include, for example, one or more additional barrier layers such as tantalum and/or tantalum nitride and/or any other suitable barrier layer that is compatible with BEOL metal level formation processes. The first liner 132 and the second liner 136 can be deposited so as to have approximately equal thicknesses. Alternatively, the first liner 132 and the second liner 136 can be deposited so as to have different thicknesses. Additionally, it is anticipated that other optional layers (not shown) could be deposited prior to deposition of the second metal layer 137 so as to line the upper portion of the contact opening 120 within the protective cap 135. These optional layers include, but are not limited to, an adhesion layer and a seed layer. The second metal layer 137 can be tungsten, cobalt, copper, aluminum, lutetium, ruthenium or any other metal that is suitable for use in MOL contacts, that is compatible with BEOL metal level formation processes and that can be deposited on the second liner 136 so as to fill the remainder of the upper portion 125 of the contact opening 137. It should be noted that, if the recessing process 218 exposes voids 134 present within the first metal layer 133, then the second liner and second metal layer materials deposited into the upper portion 125 of the contact openings 120 will also fill those voids 134 (see the embodiment 100D of the IC structure shown in FIG. 4). Various techniques for depositing such barrier and metal materials are well known in the art and, thus, the details have been omitted from the specification in order to allow the reader to focus on the salient aspects of the disclosed methods.

In any case, following deposition of the second metal layer 137 at process 222, a chemical-mechanical polishing (CMP) process can be performed such that the top surface of protective cap and, particularly, of the second metal layer 137 of the protective cap 135 and the top surface of the ILD material 150 are essentially co-planar (224). After the MOL contacts 130 are formed, as described above, BEOL metal level formation processes can be performed in order to complete the IC structure (226).

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Disclosed above are various embodiments of an integrated circuit (IC) structure with middle of the line (MOL) contacts that incorporate a protective cap, which provides protection from damage during subsequent BEOL metal level formation processes. Specifically, each MOL contact can have a main body in a lower portion of a contact opening. The main body can have a liner (e.g., a titanium and/or titanium nitride liner) that lines the lower portion and a metal layer on the liner. The MOL contact can further have a protective cap in an upper portion of the contact opening on the top surface of the first metal layer and extending laterally over the liner to the sidewalls of the contact opening. The protective cap can have an optional liner, which is different from the liner in the lower portion (e.g., which is devoid of titanium and titanium nitride), and can further have a metal layer, which is either the same metal used in the main body or a different metal. Also disclosed above are methods of forming such IC structure embodiments.

What is claimed is:
1. An integrated circuit structure comprising:
  interlayer dielectric material above a semiconductor device; and
  a contact in a contact opening that extends vertically through the interlayer dielectric material, the contact opening having sidewalls, a lower portion and an upper portion above the lower portion and the contact comprising:
    a main body in the lower portion and electrically connected to the semiconductor device, the main body comprising:
      a first liner lining the lower portion; and
      a first metal layer on the first liner within the lower portion; and
    a protective cap in the upper portion and comprising:
      a second liner lining the upper portion,
        the second liner and the first liner comprising different materials,
        the second liner having a first portion immediately adjacent to and covering a top surface of the first metal layer and extending laterally over an upper edge of the first liner to the sidewalls, and
        the second liner further having a second portion immediately adjacent and extending upward along the sidewalls of the upper portion; and
      a second metal layer immediately adjacent to the second liner.
2. The integrated circuit structure of claim 1, the first liner comprising at least one barrier layer comprising any of titanium and titanium nitride and the first metal layer comprising tungsten.
3. The integrated circuit structure of claim 1, the interlayer dielectric material and the protective cap having essentially co-planar top surfaces.
4. The integrated circuit structure of claim 1, the upper edge of the first liner being essentially co-planar with the top surface of the first metal layer.
5. The integrated circuit structure of claim 1, the first metal layer having a void, the first portion of the second liner lining the void, and the second metal layer further extending into the lower portion and filling the void.
6. The integrated circuit structure of claim 1, the second metal layer being a same metal as the first metal layer.
7. The integrated circuit structure of claim 1, the second metal layer being a different metal than the first metal layer.
8. An integrated circuit structure comprising:
  interlayer dielectric material above a semiconductor device; and
  a contact in a contact opening that extends vertically through the interlayer dielectric material, the contact opening having sidewalls, a lower portion and an upper portion above the lower portion and the contact comprising:
- a main body in the lower portion and electrically connected to the semiconductor device, the main body comprising:
  - a first liner lining the lower portion and comprising any of titanium and titanium nitride; and
  - a first metal layer on the first liner within the lower portion; and
- a protective cap in the upper portion and comprising:
  - a second liner lining the upper portion,
    - the second liner comprising any of tantalum and tantalum nitride,
    - the second liner having a first portion immediately adjacent to and covering a top surface of the first metal layer and extending laterally over an upper edge of the first liner to the sidewalls, and
    - the second liner further having a second portion immediately adjacent and extending upward along the sidewalls of the upper portion; and
  - a second metal layer immediately adjacent to the second liner.

9. The integrated circuit structure of claim 8, the first metal layer comprising tungsten.

10. The integrated circuit structure of claim 8, the interlayer dielectric material and the protective cap having essentially co-planar top surfaces.

11. The integrated circuit structure of claim 8, the upper edge of the first liner being essentially co-planar with the top surface of the first metal layer.

12. The integrated circuit structure of claim 8, the first metal layer having a void, the first portion of the second liner lining the void, and the second metal layer further extending into the lower portion and filling the void.

13. The integrated circuit structure of claim 8, the second metal layer being a same metal as the first metal layer.

14. An integrated circuit structure comprising:
- interlayer dielectric material above a semiconductor device; and
- a contact in a contact opening that extends vertically through the interlayer dielectric material, the contact opening having sidewalls, a lower portion and an upper portion above the lower portion and the contact comprising:
  - a main body in the lower portion and electrically connected to the semiconductor device, the main body comprising:
    - a first liner lining the lower portion; and
    - a first metal layer on the first liner within the lower portion; and
  - a protective cap in the upper portion and comprising:
    - a second liner lining the upper portion,
      - the second liner and the first liner comprising different materials and having different thicknesses,
      - the second liner having a first portion immediately adjacent to and covering a top surface of the first metal layer and extending laterally over an upper edge of the first liner to the sidewalls, and
      - the second liner further having a second portion immediately adjacent and extending upward along the sidewalls of the upper portion; and
    - a second metal layer immediately adjacent to the second liner.

15. The integrated circuit structure of claim 14, the first liner comprising any of titanium and titanium nitride, and the second liner comprising any of tantalum and tantalum nitride.

16. The integrated circuit structure of claim 14, the interlayer dielectric material and the protective cap having essentially co-planar top surfaces.

17. The integrated circuit structure of claim 14, the upper edge of the first liner being essentially co-planar with the top surface of the first metal layer.

18. The integrated circuit structure of claim 14, the first metal layer having a void, the first portion of the second liner lining the void, and the second metal layer further extending into the lower portion and filling the void.

19. The integrated circuit structure of claim 14, the second metal layer being a same metal as the first metal layer.

20. The integrated circuit structure of claim 14, the second metal layer being a different metal than the first metal layer.

* * * * *